(12) United States Patent
Miyashita et al.

(10) Patent No.: US 6,313,456 B1
(45) Date of Patent: Nov. 6, 2001

(54) SOLID STATE IMAGING DEVICE HAVING A BOX-SHAPED CIRCUIT BOARD

(75) Inventors: Taketo Miyashita; Hitoshi Kajinami, both of Tokyo; Yasuyuki Suzuki, Kanagawa, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/489,834

(22) Filed: Jan. 24, 2000

(30) Foreign Application Priority Data

Jan. 25, 1999 (JP) .............................................. P11-015868

(51) Int. Cl.[7] ................................................... H01L 27/00
(52) U.S. Cl. ......................................... 250/208.1; 250/239
(58) Field of Search .................................. 250/208.1, 239, 250/201.3; 257/290, 291, 431–435; 348/294

(56) References Cited

U.S. PATENT DOCUMENTS 4,831,456 * 5/1989 Takamura .............................. 358/229

* cited by examiner

*Primary Examiner*—Que T. Le
(74) *Attorney, Agent, or Firm*—Sonnenschein, Nath & Rosenthal

(57) ABSTRACT

The present invention is to obtain a solid state image pick-up device capable of downsizing an image pick-up unit and further decreasing the rigid end portion of an endoscope or the like in diameter and length. An image pick-up unit (13) is formed by a solid state image pick-up chip (18) which is not packaged and a circuit board (20) for mounting electronic parts (19) thereon which is jointed to the rear side of the solid state image pick-up chip (18): the circuit board (20) formed by a film shaped board is formed into a box by bending the same board with its main portion (26) as a reference, so as to accommodate a conductive pattern and a terminal portion; a bonding pad (25) provided in the solid state image pick-up chip (18) and a bonding pad (33) provided in the circuit board (20) are electrically connected by a bonding wire or connecting means (36) comprising a film forming a wiring pattern; the electronic parts (19) are mounted inside the box-shaped circuit board; a signal cable (35) is connected to the terminal portion (34); and the above-mentioned circuit board (20) is designed to be accommodated in a projection area of the solid state image pick-up chip (18).

8 Claims, 8 Drawing Sheets

SOLID STATE IMAGING DEVICE HAVING A BOX-SHAPED CIRCUIT BOARD

RELATED APPLICATION DATA

The present application claims priority to Japanese Application No. P11-015868 filed Jan. 25, 1999 which application is incorporated herein by reference to the extent permitted by law.

BACKGROUND OF THE INVENTION

1. Field of the Invention

The present invention relates to a solid state imaging device that is applied to, for example, an electronic endoscope or the like. More particularly, it is to realize miniaturization of a solid state imaging unit by constituting it in that a projection area of a solid state imaging chip comprising a CCD, not packaged, can accommodate a circuit board, the electronic parts to be mounted thereon, and a signal cable connected to a terminal, thereby to decrease the outer diameter and length of the end portion of an electronic endoscope or the like.

2. Description of the Related Art

Recently, various kinds of electronic endoscopes using a solid state imaging chip with a charged coupled device (CCD) or the like as an imaging means have been proposed, and this solid state imaging chip is embedded in a rigid end portion of a tube of the endoscope to be inserted into a body. Therefore, it is preferable that the diameter and length of the end portion of the tube is lessened as much as possible in order to relieve a patient's pain. Accordingly, how much degree the solid state imaging chip can be miniaturized is a very important technical theme.

Figure 1:
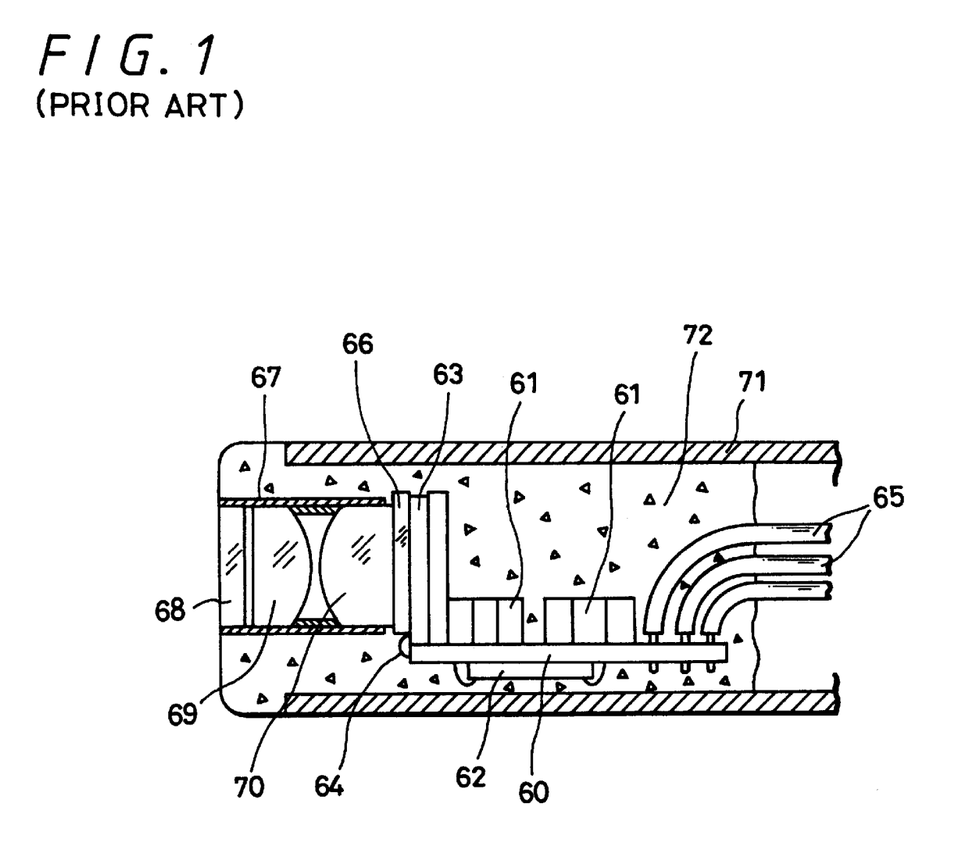
FIG. 1 is a cross sectional view of an endoscope with the conventional solid state imaging device built therein.

An endoscope using the conventional solid state imaging chip is disclosed in, for example, the Patent Publication No. 2607542 (Japanese Patent Publication Laid-Open No. 63-313970) and an example of the structure of this endoscope is shown in FIG. 1. Electronic parts 61 and 62 are mounted on one surface (upper surface) and the other surface (lower surface) of a circuit board, indicated by the reference numeral 60, which is horizontally disposed. A solid state imaging chip 63 that is not packaged with the electronic parts 61 is coupled to one end portion of the circuit board 60 in an orthogonal direction. The circuit board 60 and the solid state imaging chip 63 are electrically connected to each bonding pad, not illustrated, that is provided in the end surface of the circuit board 60 and in the front surface of the solid state imaging chip 63, by a bonding wire 64. Signal cables 65 are connected to the other end portion of the circuit board 60.

The front portion of the solid state imaging chip 63 is sealed and covered with a cover glass 66, and optical lenses 68, 69, and 70 supported by a cylindrical mirror 67 in accordance with an optical axis of the solid state imaging chip 63 are disposed in the front of the cover glass 66. The above-mentioned components are respectively covered with a sheath 71, and a space within the sheath 71 is charged with a molding material 72.

As another example, there is an endoscope disclosed in, for example, the Japanese Patent Publication Laid-Open No. 63-290541. In the endoscope, a metal plate with the solid state imaging chip bonded thereto, a circuit board with electronic parts mounted thereon, and a base connecting the circuit board to a signal cable are disposed in parallel, and these elements are electrically connected by a cylindrical flexible board around their peripheral portion.

The endoscope disclosed in the Patent Publication No. 2607542, however, needs a bonding space in the outer circumferential portion around the solid state imaging chip 63, because of adopting a method of connecting one end of the circuit board 60 to the solid state imaging chip 63 by the bonding wire 64, and the outer diameter of the end portion of the endoscope necessarily becomes larger for the space, which has been an impediment to reducing the diameter at the end portion of the endoscope. Further, since the signal cable 65 is connected to the other end of the circuit board 60 on the surface with the electronic parts 61 mounted thereon, the circuit board 60 needs the length more for the connection, which has been an impediment to shortening the length at the rigid end portion of the endoscope.

While, in the endoscope disclosed in the Japanese Patent Publication Laid-Open No. 63-290541, the solid state imaging device needs a space for bonding and electrically connecting the solid state imaging chip, metal plate, circuit board, and base in the longitudinal direction of the rigid end portion of the endoscope, and therefore the rigid end portion of the endoscope cannot help getting longer for the space. Since the outer peripheral portion around the solid state imaging chip, metal plate, circuit board, and base is surrounded by a cylindrical flexible board to connect them electrically, the diameter of the rigid end portion of the endoscope cannot help getting larger. Accordingly, it is impossible to further decrease the rigid end portion of the endoscope in diameter and length.

In order to solve the above-mentioned problems, the object of the present invention is to miniaturize an imaging unit, thereby to obtain a solid state imaging device capable of further decreasing the rigid end portion of an endoscope in diameter and length.

SUMMARY OF THE INVENTION

In order to achieve the above-mentioned object, a solid state imaging device according to an embodiment of the present invention has such a structure that a projection area of a solid state imaging chip which is not packaged can accommodate a circuit board in a way of folding it like a box and that this box-shaped circuit board can be utilized to mount the electronic parts and to connect a signal cable.

Thanks to the above structure, the outer shape of the solid state imaging chip itself which is not packaged can become actually the outer shape of an imaging unit, thereby to miniaturize the imaging unit. Further, the space within the box-shaped board can be utilized for mounting the electronic parts and connecting the signal cable, thereby to shorten the length of the circuit board. By use of this imaging unit for an endoscope, the end portion of the endoscope can be decreased in diameter and length.

Further, according to another embodiment of the present invention, in a solid state imaging device comprising an imaging unit including a solid state imaging chip which is not packaged and a circuit board for mounting electronic parts thereon which is jointed to the rear side of the solid state imaging chip, provided is a method of assembling the solid state imaging device, comprising the steps of:

forming a box-shaped board housing a conductive pattern and a terminal portion, by bending the circuit board with its main board portion as a reference and the mounting portion of the electronic parts and the terminal portion of a signal cable as each bent portion;

electrically connecting the bonding pad provided in the solid state imaging chip and the terminal provided on the circuit board by a bonding wire or connecting means comprising a patterned film; and mounting the electronic parts on the mounting portion thereof, and connecting the signal cable to the terminal, then to form the box-shaped circuit board.

DETAILED DESCRIPTION OF THE PREFERRED EMBODIMENT

With reference to the accompanying drawings, description will be hereinafter made in the case where a solid state imaging device according to embodiments of the present invention is applied to an endoscope.

Figure 2:
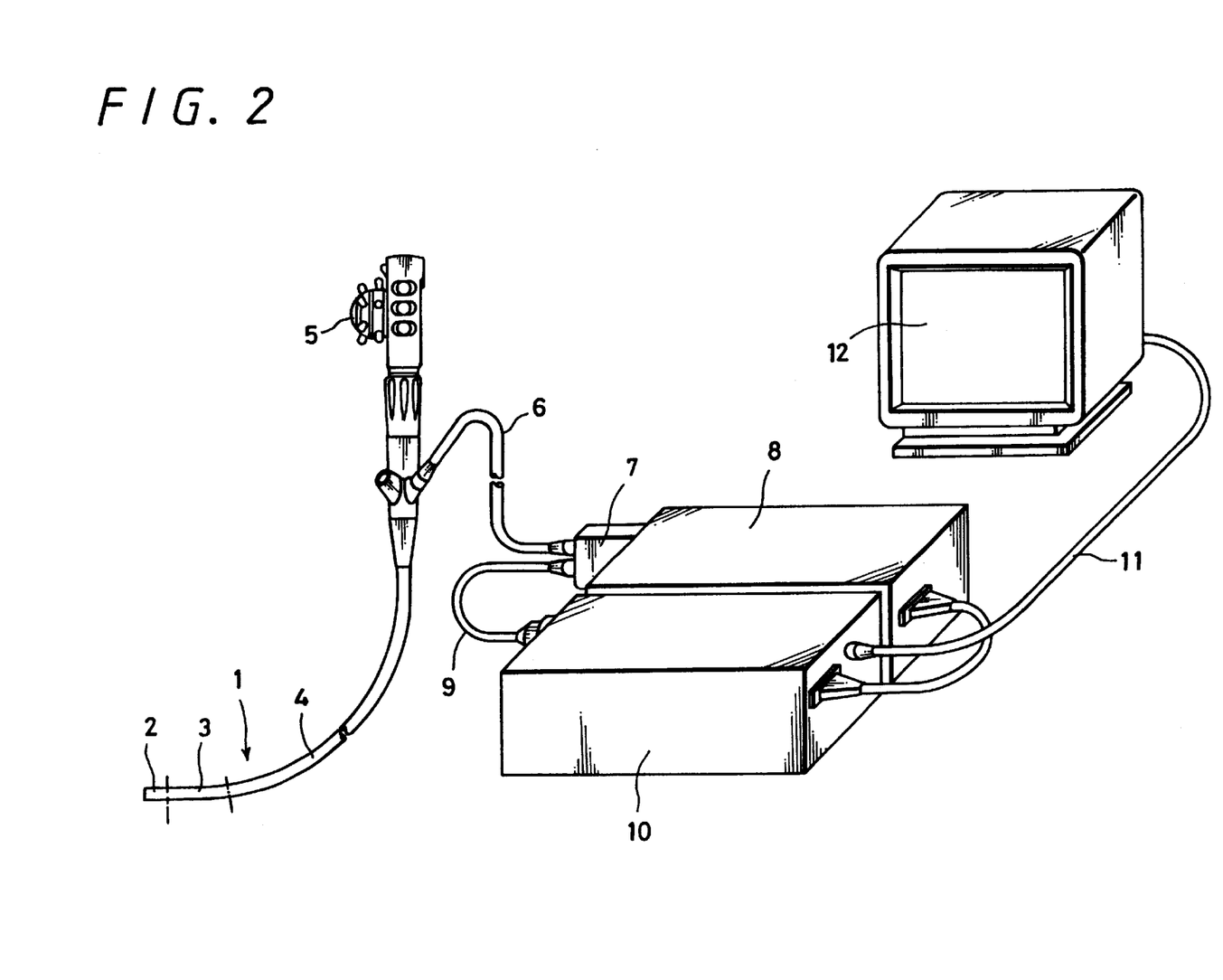
FIG. 2 is a perspective view of the whole appearance of an electronic endoscope apparatus.

FIG. 2 is a perspective view of the whole appearance of an electronic endoscope system (hereinafter, referred to as an endoscope in brief). An endoscope 1 formed by a tube is provided with a solid state imaging chip for imaging a portion to be imaged through an object lens, in its end portion 2, and the electronic endoscope 1 is inserted into a body from the end portion 2, hence to image a portion within the body and to do a medical treatment by an instrument such as a forceps and the like extended from the endoscope 1.

The tip end portion of the endoscope 1 is rigid, the rear side of the tip end portion 2 is provided with a curved portion 3 which will be curved in accordance with a change in angle of a camera, and further the rear side of the curved portion 3 is provided with an elastic portion 4 elastic enough to be insertable into a body cavity. The rear end portion of the elastic portion 4 is connected to an operation unit 5 also serving as a holding unit, and this operation unit 5 connects a signal cable, a light guide fiber, a universal code 6 including various fluid tubes and the like.

The universal code 6 is connected to a light source unit 8 through a connector 7, and the connector 7 is connected to a video processor 10 through a cable 9. Further, the video processor 10 is connected to a monitor 12 through an output cable 11. Therefore, an image signal at the portion to be imaged that is picked up by the endoscope 1 is processed by the video processor 10, to be shown on the monitor 12.

Figure 3:
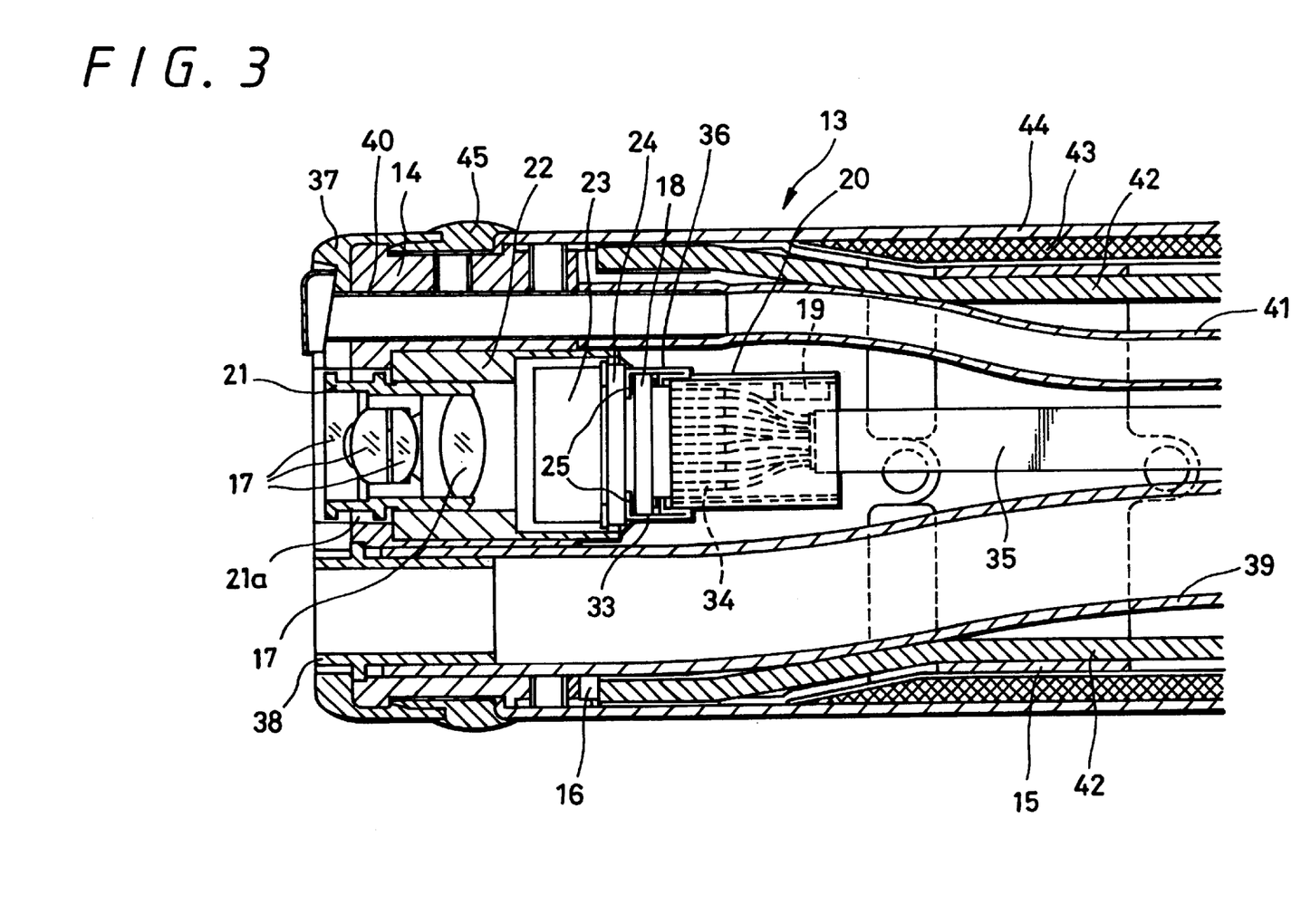
FIG. 3 is an enlarged longitudinal cross sectional view of an end portion of the endoscope.

This time, the detailed structure of the imaging unit disposed in the end portion 2 of the endoscope 1 will be described with reference to FIGS. 3 and 4. FIG. 3 is an enlarged longitudinal cross-sectional view of the end portion of the endoscope with a solid state imaging device embedded therein.

The whole imaging unit is shown by the reference numeral 13. The base of the imaging unit 13 is formed by a cylindrical main portion 14 made of metallic rigid material, and an end pipe 16, that is one of the components of the above-mentioned curved portion 3 and fixed at the end portion of an articulated frame 15 in a rotatable way, is fixed to the rear end portion of the main portion 14. The main portion 14 houses a box-shaped circuit board 20 having an optical lens system 17 including a group of object lenses and the like, a solid state imaging chip 18, and electronic parts 19 including a capacitor, a transistor, a resister, and the like mounted therein.

The optical lens system 17 is held by a cylindrical lens mirror 21, and further held by a collar 22 in order to get a good coincidence between the center of the optical axis of the optical lens system 17 and the center of the effective pixel of the solid state imaging chip 18, and they are assembled with screws, not illustrated, in a removable way. Further, an 0-ring not illustrated is provided in a concave portion 21a in the outer peripheral portion of the cylindrical lens mirror 21, thereby sealing the space around the main portion 14 so to prevent from penetration of vapor or a water drop.

Inside the collar 22, a color filter 23 is disposed behind the optical lens system 17, and a cover glass 24 disposed behind the color filter 23 is bonded by an adhesive of an epoxy system so as not to obstruct the effective pixel area.

The above-mentioned solid state imaging chip 18 not packaged is disposed behind the above-mentioned cover glass 24 in a way of overlapping with the projected area of the optical lens system 17. This cover glass 24 is protected by being sealed, for example, with the epoxy adhesive, from intrusion of dust, water drop, or gas into the pixel area of the solid state imaging chip 18. The solid state imaging chip 18 is formed by a substantially rectangular image area of, for example, 4.47 mm by 3.8 mm and several bonding pads 25, 25 positioned in the upper and lower portions of the front side thereof.

The above-mentioned circuit board 20 is fixed to the rear side of the solid state imaging chip 18. The circuit board 20 is formed by a box-shaped board in an assembling way. A development plan view viewed from the rearside of the circuit board 20 is shown in FIG. 4, and a perspective view in an assembled state is shown in FIG. 5.

The circuit board 20 consists of one film state flexible board or a flexible board of several bonded layers. A right lateral piece 27 forming the right lateral surface of the box is jointed, via a folded portion 26a, to one end (right side) of the main board portion 26 large enough to be accommodated in the projection area of the solid state imaging chip 18, namely, in the outer shape of the solid state imaging chip 18, a top piece 28 is jointed via a folded portion 27a to the upper side of the right lateral piece 27, and an adherent piece 29 is jointed via a folded portion 28a to the upper side of the top piece 28.

While, a left lateral piece 30 forming the light lateral surface of the box is jointed via a folded portion 26b to the other end (left side) of the main board portion 26, a bottom piece 31 is jointed via a folded portion 30a to the lower side of the left lateral piece 30, and an adherent piece 32 is jointed via a folded portion 31a to the lower side of the bottom piece 31.

Then, bonding pads 33, 33 each having six terminals are each formed into a pattern in the upper and lower portions of the backward surface of the main board portion 26. The back sides of the right lateral piece 27 and the top piece 28 are a surface for mounting the electronic parts thereon, and conductor patterns, not illustrated, formed on these sides are connected to the bonding pads 33, 33.

A plurality of terminal units 34 to be connected with each solid wire of a signal cable described later are formed in a pattern on the left lateral piece 30 and the bottom piece 31. The OUT terminal of each terminal unit 34 is a signal output terminal, the GND terminal and the FG terminal are an earthing terminal; +15V terminal and −7.5 terminal are a supply voltage terminal; the SUB terminal is an electronic shutter terminal; the RG terminal is a terminal for a reset gate clock; the H1 and H2 terminals are a terminal for horizontally register transfer clock; and the V1, V2, V3, and V4 terminals are a terminal for a vertically register transfer clock. A sealed wire is used for each signal line of the OUT terminal, the SUB terminal, the RG terminal, the H1 and H2 terminals, and the V1, V2, V3, and V4 terminals since they become a noise source to the outside because of having high frequencies, while an ordinal solid wire is used for each signal line of the GND terminal, the FG terminal, the +15V terminal, and the −7.5 terminal, since they don't become a noise source.

Assembly of thus constituted circuit board 20 will be performed as follows. At first, the electronic parts are mounted on the right lateral piece 27 and the top piece 28 at each predetermined position, in the circuit board 20 in a development state. Similarly, each solid wire in the signal cable 35 formed by a multi-conductor cable (refer to FIG. 5) is connected to each terminal unit 34 of the left lateral piece 30 and the bottom piece 31.

After mounting of the electronic parts and connection of the signal cable, the circuit board 20 is folded at each crease and assembled into a box, and the adherent piece 29 at one end is fixed to the outside surface of the left lateral piece 30 with the epoxy adhesive, while the adherent piece 32 at the other end is fixed to the outside surface of the right lateral piece 27 with the epoxy adhesive in the same way, thereby to form a box-shaped board as shown in FIG. 5. Namely, the electronic parts 19 and the connecting portion of the signal cable 35 mounted on the circuit board 20 can be accommodated in the box-shaped board and hidden within the same board, and further it is possible to prevent the electronic parts 19 and the signal cable 35 from interfering with each other, thereby to achieve an efficient and compact arrangement in a three-dimensional way.

Thus, in the above-mentioned circuit board 20, the main board portion 26 that is the front end surface of the circuit board 20 can be accurately fixed to the back side of the solid state imaging chip 18 by the epoxy adhesive. According to this, the box-shaped circuit board 20 does not expand beyond the projection area of the solid state imaging chip 18.

Figure 6:
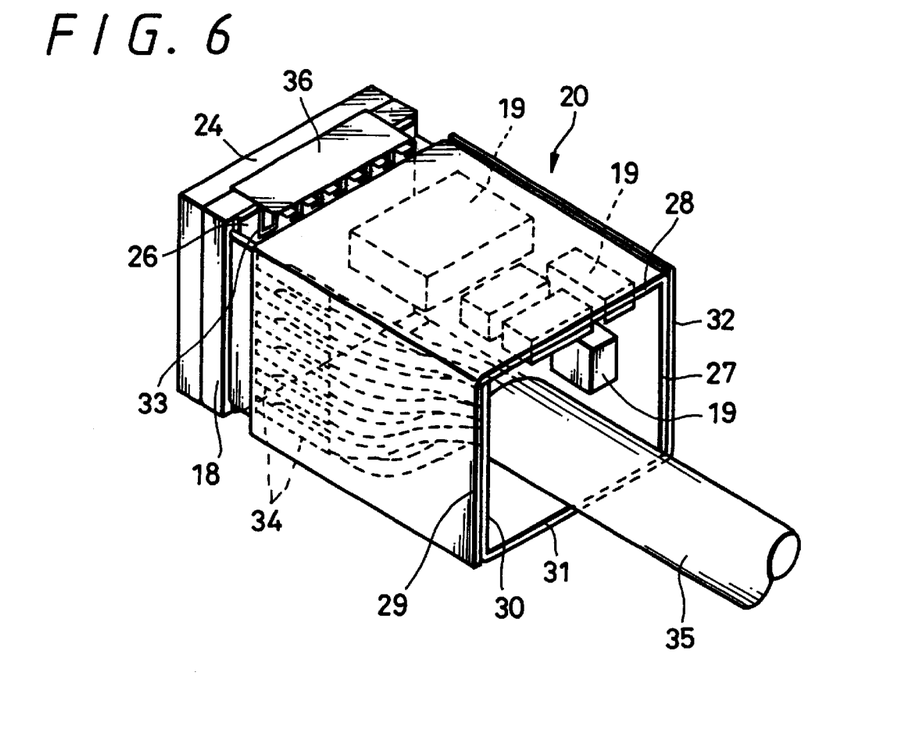
FIG. 6 is a perspective view showing the combined state of a solid state imaging chip and a circuit board.

The solid state imaging chip 18 and the circuit board 20 are electrically connected with each other by connecting means 36 such as a bonding wire or a patterned film (in this example, a patterned film is used). One end portion of the connecting means 36 is respectively connected to the bonding pads 25, 25 at the upper and lower sides of the outer peripheral portion of the solid state imaging chip 18 and then bent along the outer shape of the solid state imaging chip 18, while the other portion of the connecting means 35 is connected to the upper and lower bonding pads 32, 32 of the main board portion 26 of the circuit board 20. The signal cable 35 is connected to the operation unit 5 through the above-mentioned elastic portion 4.

A pattern formed on a film is made by metalization after grinding the surface, or pattern printing, or laser trimming after metalizing the surface in order to increase the smoothness of the surface.

On the other hand, a cover 37 with insulation treatment applied to a metal or plastic such as polyimide polyphenylene sulfide epoxy resin or the like superior in strength and moisture proof is fitted in the front of the main portion 14, and a base 38 is mounted in the opening of the main portion 14 at the distal end portion in a movable way. A resin or rubber tube 39 is fixed to the rear end of the base 38 and an instrument such as forceps or the like can be taken in and out from the base 38 by the operation of the operation unit 5 through this tube 39.

A nozzle 40 for cleaning the surface of the object lens on the front side of the optical lens system 17 is mounted in the upper portion adjacent to the cylindrical lens mirror 21. A water tube 41 extended to the operation unit 5 is connected to the nozzle 40, and the surface of the object lens is cleaned by the water or air supplied from the water tube 41.

A plurality of wires 42 are coupled to the rear portion of the end pipe 16 in a circumferential direction, and the curved portion 3 is remote controlled by the operation unit 5 operating these wires 42, and the angle of a camera is changeable. The outer peripheral portion around the articulated frame 15 and the end pipe 16 is protected by an envelope tube 44 via a mesh line 43 for reinforcement and prevention of emission. Further, the joint portion of the cover 37 and the envelope tube 44 is sealed by the adhesive 45 to get air-tightness.

The endoscope according to the present invention is constituted in the above-mentioned way, and the size of the outer diameter at the end portion of the endoscope is decided by the ratio of occupation (occupation ratio) of the solid state imaging chip 18 and the circuit board 20 including the electronic parts 19. In the present invention, the box-shaped circuit board 20 is arranged in the area the same as the projection area of the solid state imaging chip 18 not packaged or smaller than the projection area thereof, and the space within the box-shaped circuit board is utilized to install the electronic parts 19 and wire the connecting portion of the signal cable 35.

More specifically, the circuit board 20 is designed to be accommodated in the projection area of the solid state imaging chip 18. In a vertical direction of the solid state imaging chip 18, although the circuit board 20 is extended from the projection area only by the thickness of the bonding wire for connecting the solid state imaging chip 18 with the circuit board 20 or the connecting means 36 of a patterned film (for example, 35 to 50 $\mu$m), it is substantially equal to the projection area of the solid state imaging chip 18.

In a horizontal direction of the solid state imaging chip 18, the circuit board 20 is not extended from the projection area but within the projection area.

Accordingly, in the endoscope according to the present invention, the projection area of the solid state imaging chip 18 not packaged can accommodate the box-shaped circuit board 20, and the circuit board 20 can house the electronic parts 19 and the signal cable 35 compactly in a three-dimensional way, thereby downsizing the solid state imaging device and reducing the circuit board 20 in depth. Therefore, it is possible to decrease the end portion of the endoscope in length and diameter.

Figure 7:
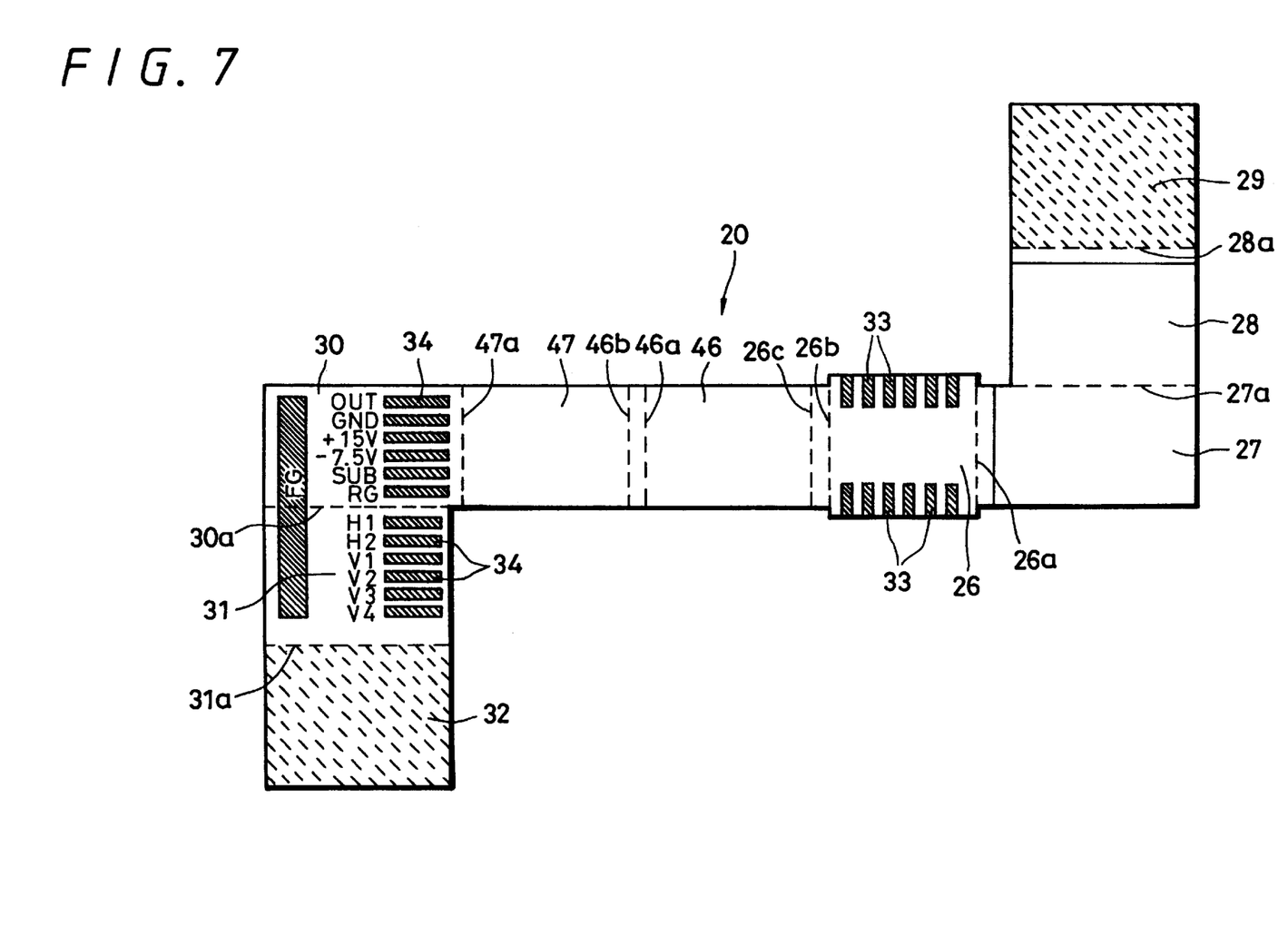
FIG. 7 is a development plan view of another example of the circuit board.
Figure 8:
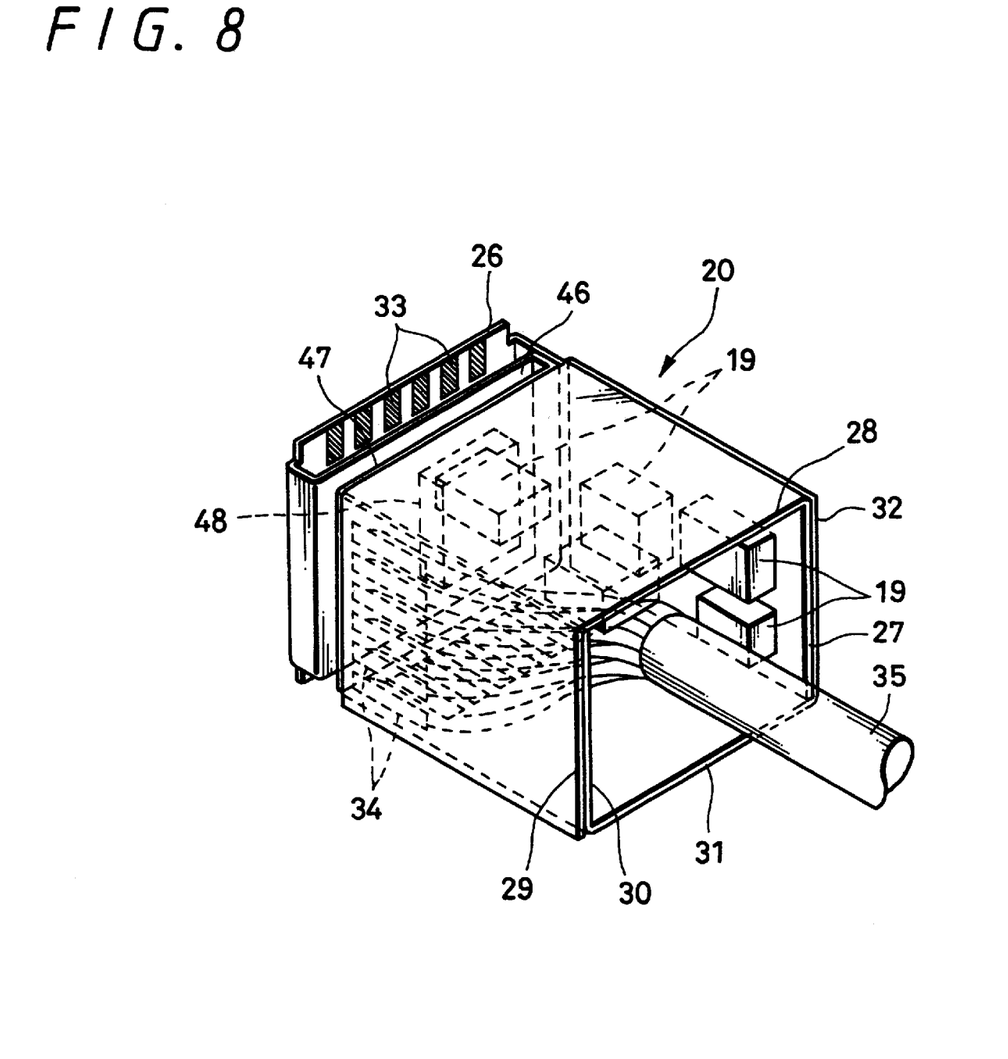
FIG. 8 is a perspective view showing the state in which electronic parts and a signal cable are similarly accommodated in a box-shaped circuit board and connected to it.

FIGS. 7 and 8 show an example of another embodiment of a box-shaped circuit board; FIG. 7 is a development plan view of a circuit board, and FIG. 8 is a perspective view of the circuit board with the electronic parts installed therein and the signal cable connected thereto. The same reference numerals are attached to the same components as those of the above-mentioned circuit board of the first embodiment.

The right lateral piece 27, the top piece 28, and the adherent piece 29 are formed and jointed to one end (right side) of the main board portion 26 in order to mount the electronic parts thereon, as in the case of the above-mentioned embodiment. While, a first extension piece 46 is jointed to the other end (left side) of the main board portion 26 via folded portions 26b and 26c which are in parallel, and a second extension piece 47 is jointed to the first extension piece 46 via folded portions 46a and 46b which are in parallel. The left lateral piece 30, the bottom piece 31, and the adherent piece 32 for forming the terminal portion 34 are jointed to the second extension piece 47 via folded portion 47a, in the same way as the above-mentioned embodiment.

In assembling thus-constituted circuit board 20, the first extension piece 46 is folded toward the back side of the main board portion 26 at the folded portions 26b and 26c and further folded back at the folded portions 46a and 46b of the second extension piece 47. Therefore, it is folded at each crease and assembled into a box, and the adherent piece 29 at one end is fixed to the outside surface of the left lateral piece 30 with the epoxy adhesive, while the adhesive piece 32 at the other end is fixed to the outside surface of the right lateral piece 27 with the epoxy adhesive in the same way as in the case of the above-mentioned embodiment, thereby to form a box-shaped board as shown in FIG. 7.

Namely, the above-mentioned circuit board 20, provided with the first and second extension pieces 46 and 47, can increase the mounting area of the electronic parts 48 in the front side of the box-shaped board, and enlarge the mounting area in the circuit board 20 easily. Since the first and second extensions 46 and 47 are folded back with narrow width in the back side of the main board portion 26, the length of the whole circuit board 20 is increased only a little by the same width, which won't much affect the whole length.

Figure 9:
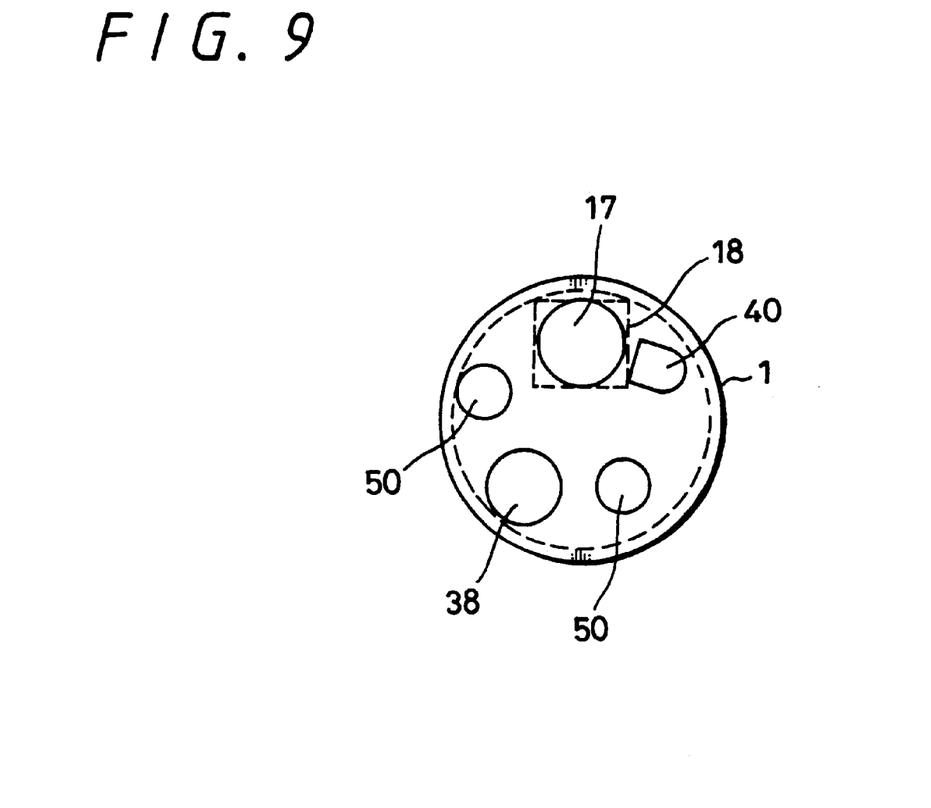
FIG. 9 is a view of arrangement seen from the front side when the endoscope employs a monocular lens camera.
Figure 10:
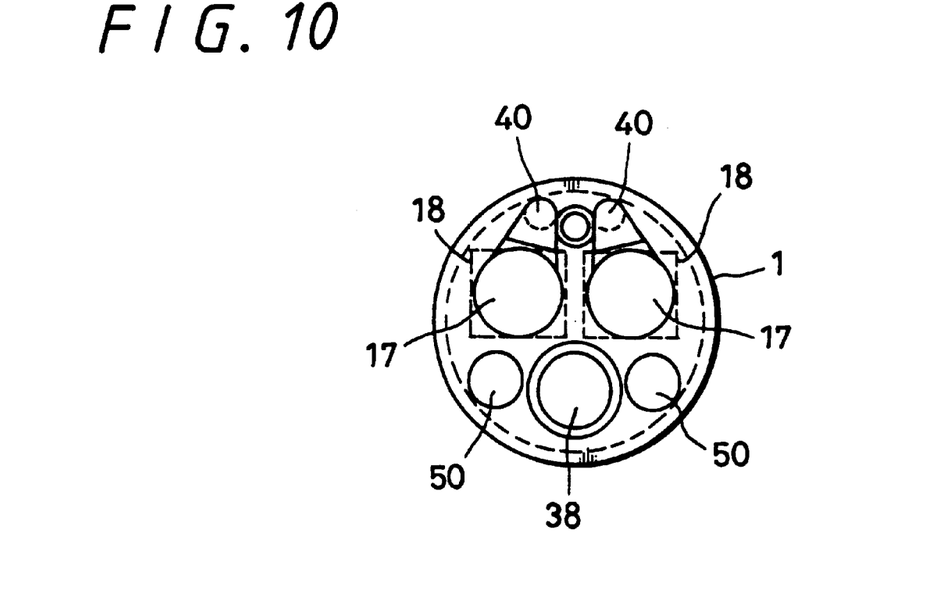
FIG. 10 is a view of arrangement seen from the front side when the endoscope employs a compound lens camera.

FIGS. 9 and 10 are views respectively showing the arrangement of two kinds of imaging units viewed from the front side of the endoscope. FIG. 9 shows an endoscope of monocular lens camera with one set of imaging unit. In this case, the optical lens system and the solid state imaging chip 18 in good agreement with the same lens system on its optical axis are positioned at the upper central portion of the endoscope 1. A pair of light guides 50, 50, not illustrated, are disposed at the both sides of the base 32 for taking in and out an instrument such as a forceps, so to illuminate the portion to be imaged.

FIG. 10 shows an endoscope of a compound lens camera with two sets of imaging units. In this case, the optical lens system 17 and the solid state imaging chip 18 in good agreement with the same lens system on its optical axis are disposed in a pair, which enables three-dimensional view of the portion to be imaged. A pair of light guides 50, 50, not illustrated, are disposed at the both sides of the base 32, so to illuminate the portion to be imaged.

The present invention is not restricted to the above-mentioned and illustrated embodiments, but various modifications may be made of the invention without departing from the spirit and scope thereof.

Although the above-mentioned both embodiments have been described in the case where the circuit board 20 is formed by a flexible board, a circuit board may be used such that each plate of the box-shaped is formed by an inflexible plate board and that the adjacent plates are jointed by a film-shaped flexible conductive foil.

Figure 4:
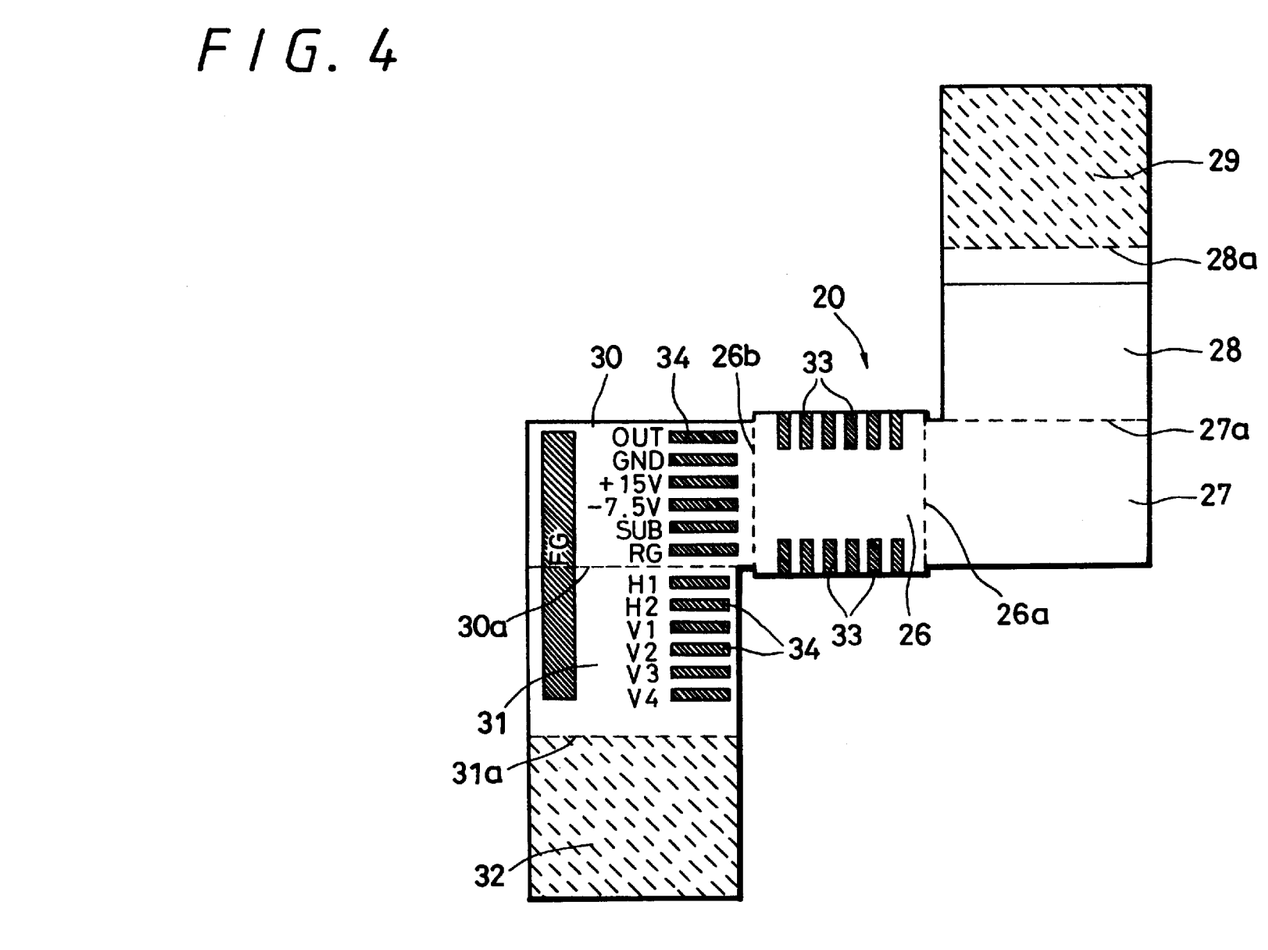
FIG. 4 is a development plan view of a circuit board.
Figure 5:
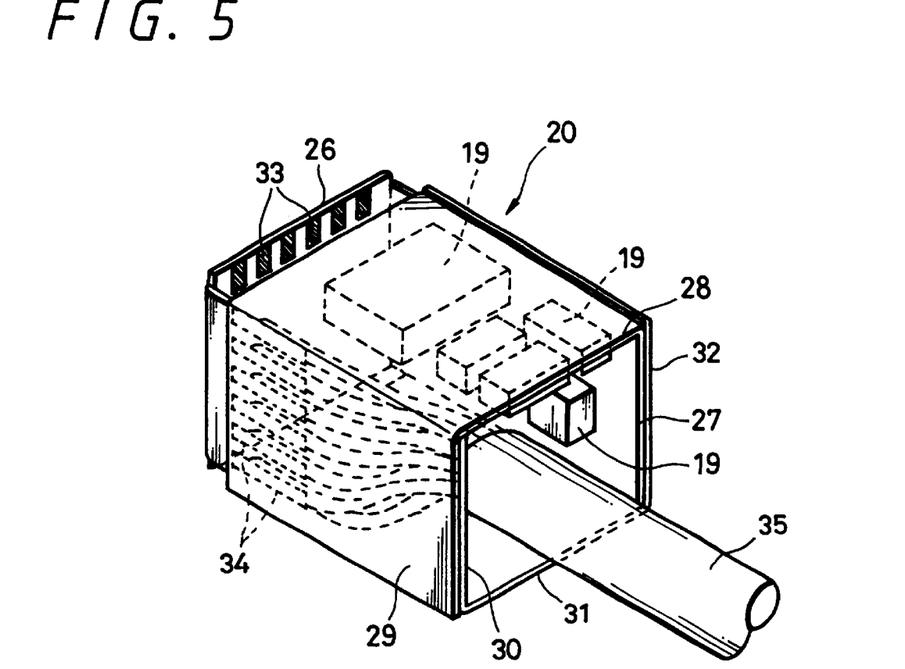
FIG. 5 is a perspective view showing the state in which electronic parts and a signal cable are accommodated in a box-shaped circuit board and connected to it.

The circuit board 20 is not necessarily restricted to that one assembled into a box from the development plan view shown in FIGS. 4 and 7, but it may be the other one assembled into a box from each various development state.

Further, it is possible to freely change the mounting surface of the electronic parts disposed within the box-shaped board as well as the position of the terminal portion of the signal cable.

Further, the solid state imaging device of the present invention can be applied not only to an imaging camera for an endoscope but also to an imaging camera such as a tube-shaped CCD camera.

As set forth hereinabove, the solid state imaging device according to the present invention is constituted such that the projection area of the solid state imaging chip which is not packaged can accommodate a circuit board folded in a box shape, and the space within the circuit board is used to mount the electronic parts and connect the signal cable, in a three dimensional way and densely. Therefore, the outer size of the solid state imaging chip which is not packaged can be equal to the outer shape of the imaging unit, thereby miniaturizing the imaging unit. Further, the length of a circuit board can be shortened. Application of this imaging unit to an endoscope can realize the reduction of the rigid end portion of the endoscope in diameter and length.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A solid state imaging device comprising an imaging unit including a solid state imaging chip which is not packaged and a circuit board for mounting electronic parts thereon which is jointed to the rear side of the solid state imaging chip, in which the circuit board is formed into a box by bending the same board with its main board portion as a reference, so as to accommodate a conductive pattern and a terminal portion, a bonding pad provided in the solid state imaging chip and a bonding pad provided in the circuit board are electrically connected by a bonding wire or connecting means comprising a patterned film, the electronic parts are mounted on the conductive pattern inside the box-shaped circuit board, and a signal cable is connected to the terminal portion, and the circuit board is designed to be accommodated in a projection area of the solid state imaging chip.

2. A solid state imaging device according to claim 1, in which the main board portion of the circuit board is jointed to the rear side of the solid state imaging chip, and the bonding pad formed on the main board portion and the bonding pad on the solid state imaging chip are electrically connected by the bonding wire or connecting means comprising a patterned film.

3. A solid state imaging device according to claim 1, in which the box-shaped circuit board is disposed on the rear side of the main board portion of the circuit board via an extension board and the electronic parts are mounted also on the extension board.

4. A solid state imaging device according to claim 1, in which the imaging unit is applied to an electronic endoscope.

5. In a solid state imaging device comprising an imaging unit including a solid state imaging chip which is not packaged and a circuit board for mounting electronic parts thereon which is jointed to the rear side of the solid state imaging chip, a method of assembling the solid state imaging device, comprising the steps of:

forming a box-shaped board housing a conductive pattern and a terminal portion, by bending the circuit board with its main board portion as a reference and with the mounting portion of the electronic parts and the terminal portion of a signal cable as each bent portion;

electrically connecting a bonding pads provided in the solid state imaging chip and a terminal provided on the circuit board by a bonding wire or connecting means comprising a patterned film, and mounting the electronic parts on the mounting portion thereof and connecting the signal cable to the terminal, thereby to form the box-shaped circuit board.

6. A method of assembling the solid state imaging device according to claim 5, further comprising a step of jointing the main board portion of the circuit board to the rear side of the solid state imaging chip, and further electrically connecting the bonding pad formed on the main board portion and the bonding pad on the solid state imaging chip by the bonding wire or connecting means comprising a patterned film.

7. A method of assembling the solid state imaging device according to claim 5, further comprising a step of disposing the box-shaped circuit board through an extension board on the rear side of the main board portion of the circuit board and mounting the electronic parts also on the extension board.

8. A method of assembling the solid state imaging device according to claim 5, further comprising a step of applying the imaging unit to an electronic endoscope.

* * * * *